United States Patent
Couderc et al.

(10) Patent No.: US 8,716,904 B2
(45) Date of Patent: May 6, 2014

(54) VARIABLE-SPECTRUM HIGH-POWER ELECTRICAL PULSE GENERATOR, AND FACILITY AND EQUIPMENT OPERATING SUCH A GENERATOR

(75) Inventors: Vincent Couderc, Verneuil-sur-Vienne (FR); Bertrand Vergne, Mulhouse (FR); Philippe Leveque, Panazol (FR)

(73) Assignees: Universite de Limoges, Lomoges (FR); Centre National de la Recherche Scientifique-CNRS, Paris (FR); Institut Franco-Allemand de Recherches de Saint-Louis, Saint-Louis (FR)

( * ) Notice: Subject to any disclaimer, the term of this patent is extended or adjusted under 35 U.S.C. 154(b) by 561 days.

(21) Appl. No.: 12/937,340

(22) PCT Filed: Apr. 10, 2009

(86) PCT No.: PCT/FR2009/000421
§ 371 (c)(1),
(2), (4) Date: Aug. 22, 2011

(87) PCT Pub. No.: WO2009/133300
PCT Pub. Date: Nov. 5, 2009

(65) Prior Publication Data
US 2011/0291492 A1 Dec. 1, 2011

(30) Foreign Application Priority Data
Apr. 11, 2008 (FR) ...................... 08 52444

(51) Int. Cl.
*H03K 3/00* (2006.01)
*H03K 3/64* (2006.01)

(52) U.S. Cl.
USPC ........................................ 307/106

(58) Field of Classification Search
USPC ......................... 307/106, 108, 149
See application file for complete search history.

(56) References Cited

U.S. PATENT DOCUMENTS 3,703,661 A 11/1972 Le Goff
4,782,222 A 11/1988 Ragle et al.
(Continued)

FOREIGN PATENT DOCUMENTS

FR 2 895 847 7/2007
WO WO 2007/074229 7/2007

OTHER PUBLICATIONS

Smirl, Arthur L. et al.; "Heavy-Hole and Light-Hole Quantum Beats in the Polarization State of Coherent Emission From Quantum Wells;" IEEE Journal of Quantum Electronics, vol. 35, No. 4, Apr. 1999; pp. 523-531.

(Continued)

*Primary Examiner* — Carlos Amaya
(74) *Attorney, Agent, or Firm* — Harness, Dickey & Pierce, P.L.C.

(57) ABSTRACT

The present disclosure relates to a high-voltage pulse generator including a "frozen-wave" generation system for generating high-voltage pulses and a trigger system for triggering the pulses, the generation system including a first and a second photoconductor element, wherein the triggering system includes means for generating a laser light beam and means for splitting the laser beam into two laser beam fractions, each laser beam fraction being directed onto a photoconductor element of the generation system, the splitting means being capable of controlling the distribution of the respective powers of the two laser beam fractions as a function of the orientation of the polarization of the laser beam. The present disclosure also relates to a facility comprising multiple high-voltage pulse generators and electrooptic pump-probe equipment operating such a high-voltage pulse generator.

14 Claims, 4 Drawing Sheets

(56) References Cited

U.S. PATENT DOCUMENTS

| | | | |
|---|---|---|---|
| 5,414,540 | A | 5/1995 | Patel et al. |
| 5,414,541 | A | 5/1995 | Patel et al. |
| 5,936,732 | A | 8/1999 | Smirl et al. |
| 7,343,100 | B2 * | 3/2008 | Yao .............................. 398/152 |
| 7,605,632 | B2 | 10/2009 | Couderc et al. |
| 2006/0120412 | A1 | 6/2006 | Liu |
| 2009/0207869 | A1 | 8/2009 | Dantus et al. |
| 2009/0296744 | A1 | 12/2009 | Dantus et al. |
| 2010/0158054 | A1 | 6/2010 | Pioger et al. |
| 2010/0187208 | A1 | 7/2010 | Dantus et al. |

OTHER PUBLICATIONS

Walecki, W.J. et al.; "Characterization of the Polarization State of Weak Ultrashort Coherent Signals by Dual-Channel Spectral Interferometry;" Optics Letters, vol. 22, No. 2, Jan. 15, 1997; pp. 81-83.

Ziegler, L.D. et al.; "Nonlinear Polarization Description of Phase-Locked Pulse-Pair Spectroscopy;" J. Chem. Phys. 97, No. 7, Oct. 1, 1992; pp. 4704-4713.

Wollenhaupt, M. et al.; "Interferences of Ultrashort Free Electron Wave Packets;" Physical Review Letters, vol. 89, No. 17, Oct. 21, 2002; pp. 173001-1-173001-4.

Oron, Dan et al.; "Femtosecond Phase-and-Polarization Control for Background-Free Coherent Anti-Stokes Raman Spectroscopy;" Physical Review Letters, vol. 90, No. 21, May 2003; pp. 213902-1-213902-4.

Dudovich, Nirit et al.; "Quantum Control of the Angular Momentum Distribution in Multiphoton Absorption Processes;" Physical Review Letters, vol. 92, No. 10, Mar. 2004; pp. 103003-1-103003-4.

Brixner, T. et al.; "Generation and Characterization of Polarization-Shaped Femtosecond Laser Pulses;" Appl. Phys. B 74, 2002; pp. S133-S144.

Kröner, Dominik et al.; "Asymmetric Laser Excitation in Chiral Molecules: Quantum Simulations for a Proposed Experiment;" Chemical Physics Letters 373, Elsevier, XP-002431288, 2003; pp. 242-248.

Hoki, K. et al.; "Locally Designed Pulse Shaping for Selective Preparation of Enantiomers From Their Racemate;" Journal of Chemical Physics, vol. 114, No. 4, XP009082805, Jan. 22, 2001; pp. 1575-1581.

Bychkov, S.S. et al.; "Laser Synthesis of Chiral Molecules in Isotrophic Racemic Media;" Journal of Experimental and Theoretical Physics, vol. 93, No. 1, 2001; pp. 24-32.

Hoki, K. et al.; "Selective Preparation of Enantiomers From a Racemate by Laser Pulses: Model Simulation for Oriented Atropisomers With Coupled Rotations and Torsions;" Chemical Physics 267, Elsevier, 2001; pp. 59-79.

Brixner, T. et al.; "Quantum Control by Ultrafast Polarization Shaping;" Physical Review Letters, vol. 92, No. 20, May 2004; pp. 208301-1-208301-4.

Thanopulos, I, et al.; "Laser-Driven Coherent Manipulation of Molecular Chirality;" Chemical Physics Letters 390, Elsevier, XP-002442134, 2004; pp. 228-235.

Peifang Tian et al.; "Femtosecond Phase-Coherent Two-Dimensional Spectroscopy;" Science, vol. 300, XP-002442136, Jun. 6, 2003; pp. 1553-1555.

Wu, Chengyin, et al.; "Laser-Induced Dissociation and Explosion of Methane and Methanol;" Journal of Physics B: Atomic, Molecular and Optical Physics 35, XP-002442137, 2002; pp. 2575-2582.

Pfeiffer, W. et al.; "Ultrafast Spatio-Temporal Near-Field Control;" European Quantum Electronics Conference, 2005; p. 169.

\* cited by examiner

VARIABLE-SPECTRUM HIGH-POWER ELECTRICAL PULSE GENERATOR, AND FACILITY AND EQUIPMENT OPERATING SUCH A GENERATOR

CROSS-REFERENCE TO RELATED APPLICATIONS

This application is a National Phase Entry of International Application No. PCT/FR2009/000421, filed on Apr. 10, 2009, which claims priority to French application Ser. No. 08/52444, filed on Apr. 11, 2008, both of which are incorporated by reference herein.

TECHNICAL FIELD

This invention relates to a variable-spectrum high-power electrical pulse generator, as well as an installation and equipment implementing such a generator. This invention relates to the field of high-power electrical pulse generators. It relates more specifically to a high-voltage pulse generator including a system for generating high-power pulses with frozen waves and a system for activating said pulses, in which said generation system includes a first and a second photoconductive element.

BACKGROUND

Such a generator is intended to be used in applications in which it is necessary to transmit high-power short (on the order of a nanosecond or above) electrical pulses (several kilovolts). It is also important that it be capable of being synchronized with other electrical or optical systems. The prior art comprises purely electronic pulse generators. These generators make it possible to produce high-power electrical pulses lasting between several picoseconds and several milliseconds. Nevertheless, these generators are not capable of being perfectly synchronized with one another and also do not enable the spectral content of the output pulse to be controlled.

To obtain high-power short electrical pulses—typically on the order of the nanosecond or above—it is known to use optoelectronic switching generators, called frozen wave generators. These generators use various semiconductor substrates. A number of switching modes are known, including a so-called "avalanche" mode and a so-called "linear" mode.

A generator using an avalanche switching system is described in the patent document U.S. Pat. No. 4,782,222. This generator includes a semiconductor substrate block, two conductive elements coupled to said block and separated by a determined distance, a high-voltage power supply arranged between the two conductive elements as well as means for illuminating said block at a given wavelength so that most of the light penetrates said block over a distance below the distance between said two conductive elements. Such a system makes it possible to perform very high-voltage switching while requiring little optical energy.

The photoconductor systems operating in an avalanche mode nevertheless have a certain number of disadvantages, including a significant time jitter (on the order of several tens of picoseconds) for synchronizing short pulses—nanoseconds or sub-nanoseconds. This time jitter associated with optoelectronic switching limits the possibilities of perfectly controlling the time and therefore spectral profile of the electrical signal produced. This results in poor reproducibility of the short photogenerated pulses.

A linear generator is described in the publication WO 2007/074229. This generator includes means for storing electrical charges, a high-voltage source capable of charging said charge storage means. It also includes two passive doped-silicon photoconductive elements operating in a linear mode forming photosensitive switches, the first being connected to the reference potential and to storage means, and the second being connected to the storage means and to an effective charge. It finally includes a first light source capable of delivering a light pulse to said first photoconductor, a second light source capable of delivering a light pulse to said second photoconductor, as well as means for synchronizing the transmission delay between the first and the second light source.

Such a generator makes it possible to provide electrical pulses of peak-to-peak amplitude of several kilovolts for a sub-nanosecond duration of the bipolar signal. In addition, the time jitter is made very low—on the order of a picosecond—thereby making it possible to finely control the profile of the spectrum of the signal delivered. Finally, this generator enables high reproducibility of the source and has a very long lifetime.

However, a linear optoelectronic generator has a number of disadvantages. In particular, the control of the spectral content of the pulse by adjusting the time delay between the two photosensitive switches does not allow for sufficient control of said content. Moreover, the means for adjusting the time delay between the two photoswitches integrates a delay line, thereby making the system bulky. Such a generator cannot be synchronized with other electrical or optical systems. Finally, the linear mode requires a large amount of optical energy and therefore the use of bulky laser sources. Thus, there is no solution in the prior art that would make it possible to obtain a low-profile electrical pulse generator capable of being synchronized with other electrical or optical systems, with high-power (several kilovolts), short (nanosecond and below) pulses and with controllable spectral content.

SUMMARY

The objective of the present invention is to overcome these technical problems, by enabling high-voltage frozen-wave electrical pulse generators—which can provide high-power short pulses—to control the spectral content of the pulses, while making it capable of being synchronous with other electrical or optical systems. The approach of the solution involves finding, on the high-voltage frozen-wave electrical pulse generators of the prior art, other means for controlling the spectral content of the pulse than the introduction of a time delay. This led to the control of this spectral content by adjusting the power difference necessary for the illumination of each of the two semiconductor components. This difference can in particular be adjustable with a light source generating a beam, means for splitting said beam into two beam fractions as well as means for controlling the distribution of the respective powers of said two fractions of said beam. This modification of the incident power also allows for better compactness of the generator. To this end, the invention relates to a high-voltage electrical pulse generator of the type mentioned above in which, in addition to the features already mentioned, the activation system includes means for generating a laser light beam and means for splitting said laser beam into two laser beam fractions, in which each laser beam fraction is directed respectively toward a photoconductive element of the generation system, and said splitting means are capable of controlling the distribution of the respective powers of said two laser beam fractions according to the orientation of the polarization of the laser beam.

Such a generator, formed by the combination of generation and activation systems, makes it possible to solve the aforementioned technical problems, since the profile of the pulses generated can be controlled by the orientation of the polarization of the beam, which can be achieved with very high precision. This makes it possible, on the one hand, to benefit from a very low time jitter because of the high-voltage frozen-wave pulse generation system and, on the other hand, to be capable of controlling the spectral content of the pulses, as their spectral profile is adjustable. In addition, the laser beam enabling the pulses to be activated CaO be directed to other systems or generators so as to act as a reference for the synchronization of all of the systems.

In a specific embodiment, the splitting means include rectilinear polarization phase delay means and means for rectilinear polarization by beam separation arranged so as to separate said laser beam into two laser beam fractions, in which each laser beam fraction is directed respectively toward a photoconductive element of the generation system, and the distribution of the respective powers of said two laser beam fractions is controlled by orienting said rectilinear polarization phase delay means. In this case, it is the orientation of the rectilinear polarization phase delay means that will make it possible to modify the orientation of the rectilinear polarization of the laser beam coming from the laser source. The means for rectilinear polarization by beam separation will then split the laser beam into two fractions directed toward the two photoswitches. The respective powers of these two fractions will therefore be functions of the orientation of the polarization of the laser beam at the output of the rectilinear polarization phase delay means. The pulse profile will be a function of said respective powers, which will thus make it possible to control said profile by orienting the polarization of said laser beam.

In a preferred embodiment, the rectilinear polarization phase delay means are constituted by a half-wave plate of which the optical axis is perpendicular to the sighting axis of the laser beam. In a preferred embodiment, the means for rectilinear polarization by beam separation are constituted by a Wollaston-type polarizer. Advantageously, the pulse activation system also includes focusing means arranged in front of the means for rectilinear polarization by beam separation, so as to focus each laser beam fraction respectively on a photoconductive element of the generation system. The switching efficacy is thus improved.

Advantageously, the laser beam generation means are of the microlaser type. The power supplied by this type of source is indeed sufficient, on the one hand, for activating the pulses with high precision and, on the other hand, for directing a sufficient proportion of the laser beam toward other optical and/or electrical systems. Such a generator thus has a lower profile.

This invention also relates to an installation of multiple high-voltage pulse generators including N high-voltage pulse generators, in which N is greater than or equal to two, and each generator includes a high-voltage frozen-wave pulse generation system and a system for activating said pulses; said generation system includes a first and a second photoconductive element, characterized in that:

said activation system of each generator includes means for splitting a laser beam into two laser beam fractions, in which each laser beam fraction is respectively directed toward a photoconductive element of the generation system, and said splitting means are capable of controlling the distribution of the respective powers of said two laser beam fractions according to the orientation of the polarization of the laser beam, said activation system of one of said N generators includes means for generating said laser beam, said activation system of at least N−1 generators includes delay means arranged so as to synchronize said generators with one another, and each generator includes separation means arranged so as to direct a portion of said laser beam transmitted by said generation means toward said splitting means of said generator. Such an installation makes it possible to obtain a plurality of mutually synchronous pulse generators. It makes it possible in particular to generate high-voltage, high-power, short electrical pulses, which pulses are synchronized and capable of being directed toward different targets or coupled with one another to produce the coherent sum of their power.

This invention finally relates to electro-optical pump-probe equipment including a high-voltage pulse generator and a probe system, in which said generator includes a high-voltage frozen-wave pulse generation system and a system for activating said pulses, in which said generation system includes a first and a second photoconductive element, characterized in that:

said activation system includes means for generating a light laser beam and means for splitting said laser beam into at least two laser beam fractions, in which each laser beam fraction is respectively directed toward a photoconductive element of the generation system, and said splitting means are capable of controlling the distribution of the respective powers of said at least two laser beam fractions according to the orientation of the polarization of the laser beam, said generator includes separation means arranged so as to direct a portion of said laser beam toward said generation system and another portion toward said probe system, and the equipment comprises at least one delay means, which delay means are arranged on the path of one of said portions of said laser beam so as to synchronize said generator and said probe system with one another.

Such equipment has the advantage of dedicating a portion of the activation laser beam to a probe system, which can also be used for diagnostic or imaging applications. The generator—which acts as a pump system—and the probe system are thus synchronous. In addition, the absence of a time jitter between the optical pulse and the electrical photoswitched wave enables a real-time analysis of the impact thereof on biological elements. Finally, the management of the optical switching energy enables the spectrum of the electrical pulse to be modified according to the target to be analyzed.

In an embodiment intended to perform both the test and the excitation of the target, the light beams from the generator and the probe system are directed toward the same target. It is thus possible to excite the target with the generator and, at the same time, to test this same target with the same laser beam, but of which the spectrum has been expanded. In an embodiment intended to change the excitation wavelength by generating a continuum, the probe system comprises broadband nonlinear conversion means. The continuum thus generated by the conversion means is synchronous with the generator and enables the target to be tested with wavelengths different from those of the initial laser beam.

In an embodiment intended to show the result of the test of the target, the probe system comprises imaging means. In an embodiment intended to recognize given compounds on the target, the imaging means are of the CARS nonlinear type (Coherent Anti-Stokes Raman Spectroscopy). It is thus possible to cut and code the continuum generated by the nonlinear conversion means and to apply the continuum thus treated to a target. This type of imaging means enables complex—and therefore precise—signatures of a given compound to be generated by obtaining a spectrum in response to an excitation spectrum transmitted in the direction of the compound. This thus enables the recognition of a given compound by its spectrum in response to a determined excitation spectrum.

In another embodiment, the imaging means are of the nonlinear second harmonic generation type. In another embodiment, the imaging means are of the nonlinear fluorescence type.

BRIEF DESCRIPTION OF THE DRAWINGS

The invention can be better understood upon reading the detailed description of a non-limiting example embodiment, accompanied by figures showing, respectively.

DETAILED DESCRIPTION OF SPECIFIC EMBODIMENTS

Figure 1:
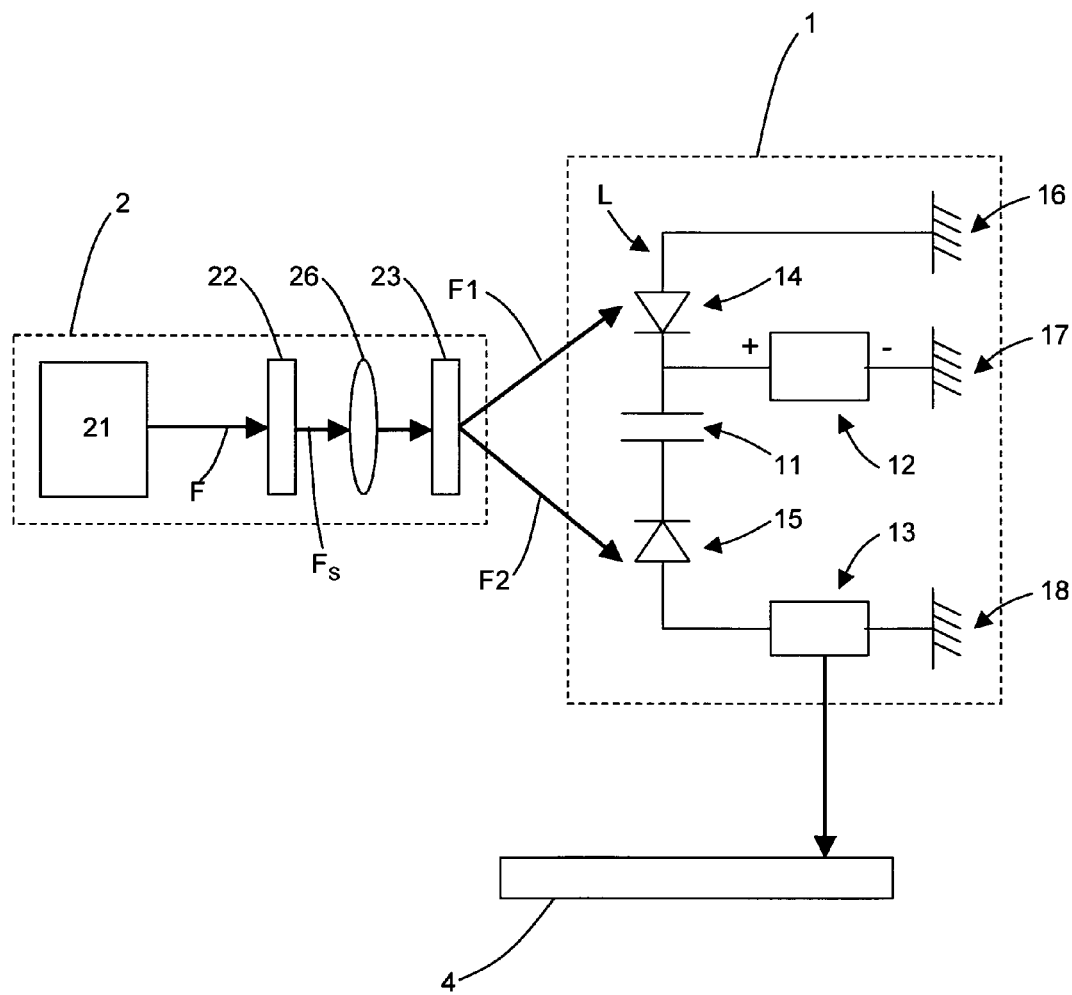
FIG. 1: a diagram of a high-voltage electrical pulse generator according to the invention.

FIG. 1 shows the diagram of a high-voltage electrical pulse generator according to the invention. The generator includes a high-voltage frozen-wave pulse generation system 1 and a system for activating said pulses 2. The electrical pulses generated enable a target 4 to be excited. The generator operates on the principle of a "frozen-wave generator"-type device.

The high-voltage frozen-wave pulse generation system 1 includes charge storage means 11, a high-voltage source 12, an effective charge 13 as well as two semiconductor elements 14 and 15. All of these elements are arranged on a transmission line L. The charge storage means 11 are constituted by a coaxial transmission line, microstrip or any type of hyperfrequency line. The high-voltage source 12 is constituted by high-voltage continuous generation means capable of charging the charge storage means 11 to which it is connected through a charge resistor included or not in this same source. It may operate in a continuous or pulsed mode. The effective charge 13 enables the transmission of the electrical pulse.

The first semiconductor element 14 is connected to reference potential 16 and to said storage means 11. The second photoconductive element 15 is connected to said storage means 11 and to said effective charge 13. The two semiconductor elements 14 and 15 are capable of being excited by two respective light beams coming from the pulse activation system 2. They are reversible if the polarity of the high-voltage source 12 is inverted and act as photoswitches.

To obtain the behavior of an open switch in the absence of light excitation, the semiconductors 14 and 15 are doped. The doping consists of an excess of periodic n-p positive and negative charges. A single doping period then constitutes a diode junction. This diode is mounted inversely with respect to the polarization of the charge storage means 11 and therefore acts as an open switch in the absence of light excitation. The two semiconductors can thus be comprised of N and P doped silicon. When the semiconductors 14 and 15 are not illuminated, they have a high specific resistance of several tens of megohms and can then be considered to be open switches.

After illumination by a brief optical pulse, the resistance of the illuminated components is substantially reduced and is close to several tens of ohms, typically 5 to 30 ohms. The switch is then closed and this closure is all the more effective as the optical energy is absorbed. This reduction in the internal resistance of the component enables the instantaneous release of the energy contained in the charge storage means 11, at the reactivity rate close to the latter. The stationary wave contained in the charge storage means 11 is then released. The fronts of this stationary wave are then propagated in two opposite directions.

Figure 2A:
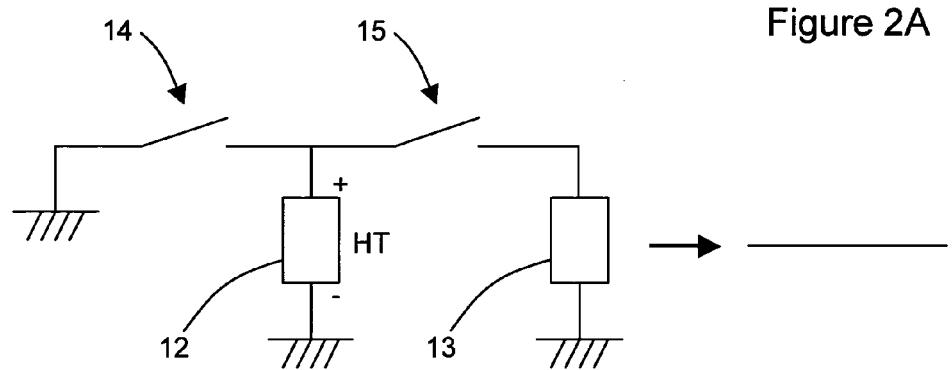
FIG. 2A: the signal delivered by the high-voltage electrical pulse generator according to the invention in the absence of light excitation.
Figure 2B:
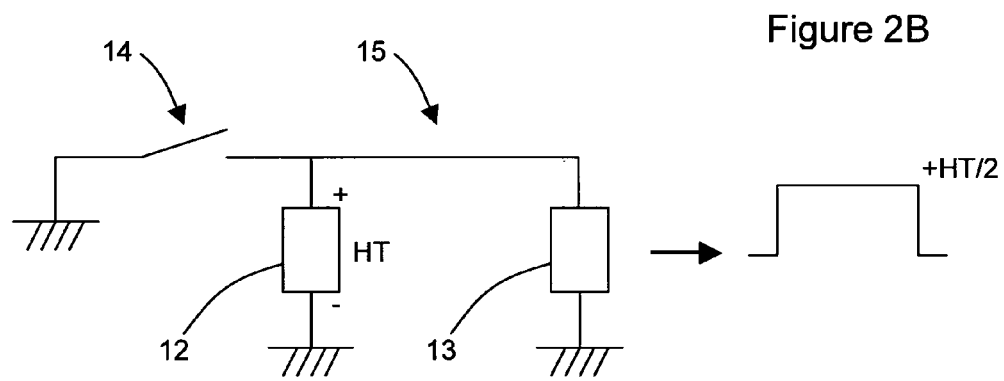
FIG. 2B: the signal delivered by the high-voltage electrical pulse generator when a single semiconductor receives light excitation.

Thus, in reference to FIG. 2A, when the semiconductors 14 and 15 are not illuminated, they can be considered to be open switches. In reference to FIG. 2B, when only the semiconductor 15 is illuminated, the wavefront propagated directly toward the effective charge 13 has a voltage with the same charge as the polarization voltage applied to the charge storage means 11. An electrical pulse is then obtained.

Figure 2C:
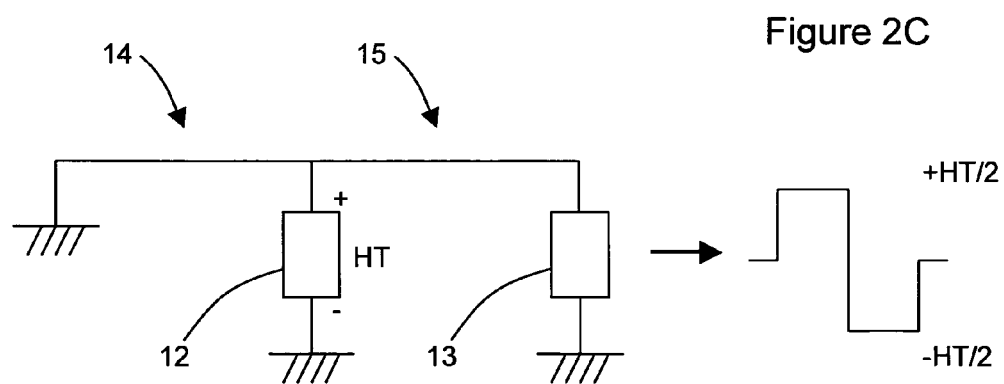
FIG. 2C: the signal delivered by the high-voltage electrical pulse generator when the two semiconductors receive light excitation.

In reference to FIG. 2C, when the two semiconductors 14 and 15 are illuminated, the wavefront propagated directly toward the effective charge 13 has a voltage with the same charge as the polarization voltage applied to the charge storage means 11. The portion of this wave propagated toward the reference potential 16 will be reflected with an inversion of its polarization. A pulse having a charge opposite that of the polarization voltage is then generated, and directly follows the first pulse with the same charge as the polarization voltage. The association of the two signals then forms a bipolar signal.

Thus, if the semiconductors are illuminated at the same time and with the same power, the generator according to the invention makes it possible to obtain a balanced single cycle, i.e. with a near-zero average value. For the generator to operate in linear mode, the two semiconductors 14 and 15 are arranged so as to operate in a linear mode. The reduction in the impedance of the semiconductors—and therefore the switched energy—is then linearly dependent on the optical energy absorbed by the semiconductors.

To best adapt the local impedance of the component to that of the transmission line and to that of the output connector, the semiconductors 14 and 15 are significantly insulated with respect to the potential by an insulating dielectric such as air, silicone, glue or Teflon. As shown again in FIG. 1, the pulse activation system 2 makes it possible to control the spectral content of the electrical pulse generated by the generation system 1. This system 2 controls the respective light powers received by each of the two semiconductors 14 and 15, and more specifically the difference between these two light powers. The control of this difference then makes it possible to modify the profile of the electrical pulse at the output of the generator and therefore to adjust the spectral content of this pulse.

More specifically, this activation system 2 includes means 21 for generating a light laser beam F, as well as means 22 and 23 for splitting said beam F into two fractions F1 and F2. The means 21 for generating a laser beam F consist of a linearly polarized optical laser source 21. This source transmits a linearly polarized light laser beam F in the direction of the splitting means 22 and 23.

The splitting means 22 and 23 perform the splitting of the light laser beam F into two beam fractions F1 and F2, in which each beam fraction is respectively directed toward one of the two semiconductor elements 14 and 15 of the generation system 1. These splitting means 22 and 23 also control this splitting, and more specifically control the difference between the respective light powers of the two beam fractions F1 and F2. In the example embodiment shown, these splitting means thus include rectilinear polarization phase delay means 22 and means for rectilinear polarization by beam separation 23.

The rectilinear polarization phase delay means 22 are in this case a half-wave plate. This is produced by a birefringent medium capable of modifying the orientation of the linear polarization direction of the beam F coming from the source 21. The beam then passes through means for rectilinear polarization by beam separation 23, or a polarizer, making it possible to transform an incident beam into two beams having perpendicular rectilinear polarizations. It thus separates the beam F into two beam fractions, F1 and F2, having perpendicular linear polarizations. Each beam fraction F1, F2 is then directed respectively toward one of the two semiconductors 14, 15.

The orientation of the polarizer 23 is fixed. The management of the power difference between the two beam fractions F1, F2 is provided by the orientation of the plate 22. Consequently, it is possible to obtain any orientation of the rectilinear polarization of the beam F. The polarizer 23 will then split the beam $F_S$ into two beam fractions F1 and F2 with polarizations oriented according to the preferred axes of the polarizer. The power difference between the two beam fractions thus formed is therefore dependent on the orientation of the polarization of the beam $F_s$ at the output of the plate, which is itself dependent on the orientation of the plate.

This type of polarizer by beam separation has the advantage of absorbing very little light, with respect to the polarizers by absorption. According to a specific embodiment, the polarizer 23 is a Wollaston-type polarizer. This type of polarizer indeed has birefringence properties that make it possible to obtain two beams F1 and F2 having mutually rectilinear and perpendicular polarizations.

This activation system 2 of the pulses according to the invention differs from the use of the activation systems according to the prior art for this type of generator and which consist of synchronization means. These synchronization means make it possible to control the delay of the two beam fractions with respect to one another, by shifting the closure times of the two photoswitches. This makes it possible to modulate the output signal, for example by supplying a signal on which the transmission duration of the positive signal is greater than the transmission duration of the negative signal. The spectral content of the signal is thus modulated. However, such synchronization means do not make it possible to perform a sufficiently precise modulation or to synchronize the electrical pulse generator thus constituted with other electrical or optical systems.

Advantageously, the laser source is a compact "microlaser"-type laser (or microchip) operating in activated mode. This type of laser produces sub-nanosecond or nanosecond pulses of several microjoules to several millijoules. The cooling of these lasers is performed by a heat exchange in the air. They operate at frequencies of between several tens of hertz and several tens of kilohertz. The pulses coming from these sources therefore make it possible to switch electrical pulses of several kilovolts and are potentially amplifiable in order to obtain even higher energies.

The high-voltage electrical pulse generator thus formed by the combination of generation 1 and activation 2 systems thus makes it possible to control the profile of the pulses generated in order to excite the target 4, and, consequently, the spectral content thereof. In addition, this generator is capable of being synchronized with other electrical and/or optical systems, or other generators according to this invention. Indeed, the laser beam F enabling the activation of pulses can be directed toward other systems or generators so as to act as a reference for the synchronization of all of the systems.

Figure 3:
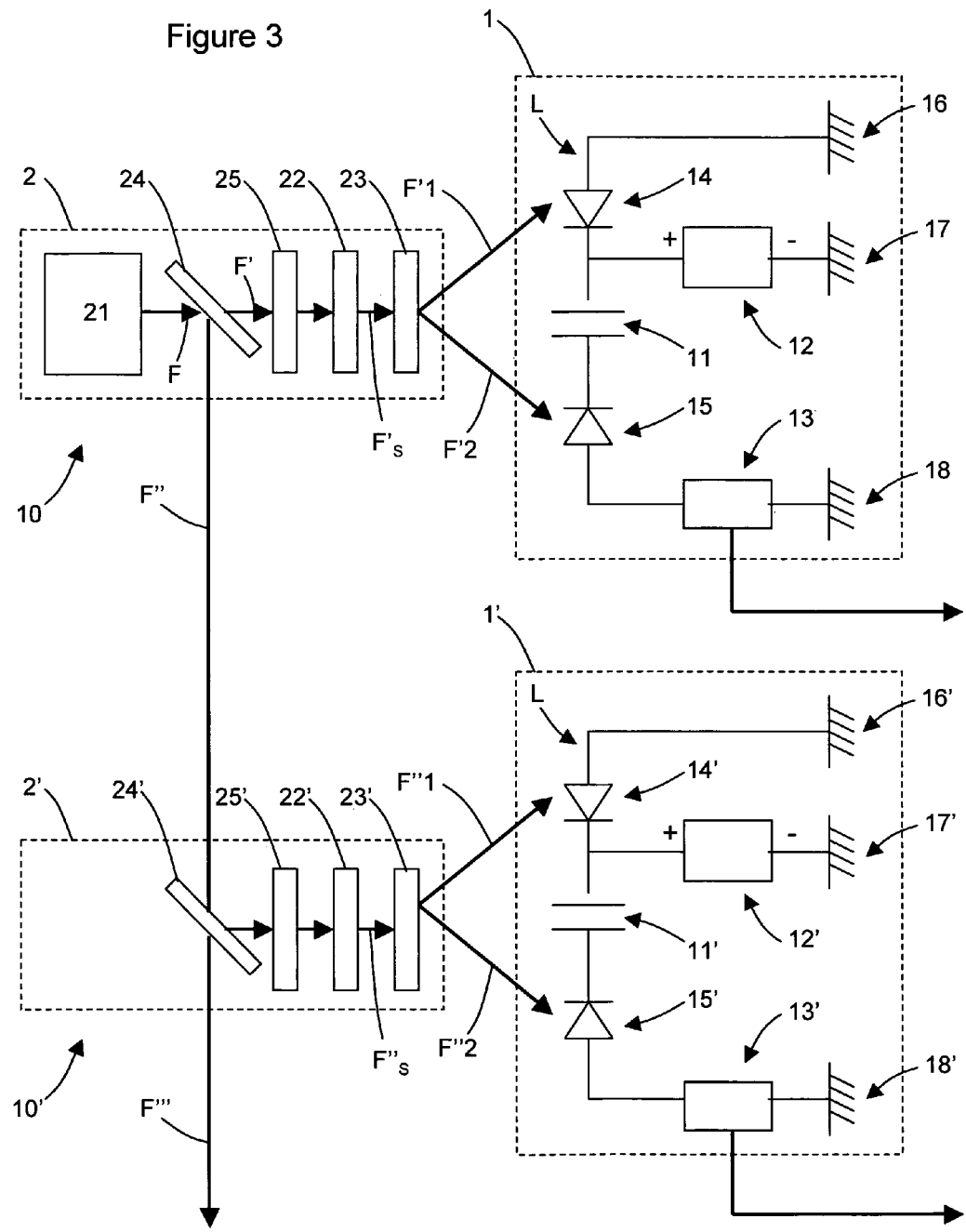
FIG. 3: an installation diagram implementing a plurality of synchronous high-voltage electrical pulses according to the invention.

As an example, FIG. 3 shows the diagram of an installation implementing a plurality of synchronous high-voltage electrical pulse generators described above, limited to two in the example shown. This installation includes a first pulse generator (10) as described above in reference to FIG. 1. The pulse generator (10') is equivalent to the first generator (10), but it does not include a laser source. Indeed, this source 21 is common to the two generators. Thus, only the first generator comprises one. The separating plate 24 makes it possible to obtain a portion F''' of the laser beam F coming from the laser source 21, which portion obtained is directed, by reflection on a separating plate 24', to the splitting means (22', 23') of the second generator, while the non-obtained portion is directed toward the splitting means (22, 23) of the first generator.

The activation system 2 includes delay means 25 arranged on the path of the beam F' making it possible to control the synchronization between the generators 1 and 1' by modifying the length of the path of the beam F'. These delay means can be a delay line comprised of a plurality of mirrors or optical fibers of which the length is modified by applying a mechanical constraint. Delay means 25' can also be arranged similarly in the activation system 2'.

According to other embodiments, the installation comprises a plurality of pulse generators according to the invention, for example from a portion F''' of the beam F'' transmitted by the plate 24', so that just one of them comprises a laser source capable of enabling the synchronization with the other generators by means of separating plates and delay lines. The installation can thus comprise N high-voltage pulse generators, in which N is greater than or equal to two. Each generator includes a high-voltage frozen-wave pulse generation system 1, 1' and a system for activating said pulses 2, 2', and said generation system 1, 1' includes a first 14, 14' and a second 15, 15' photoconductive element.

The activation system 2, 2' of each generator includes means 22, 22', 23, 23' for splitting a laser beam F', F'' into two laser beam fractions F'1, F''1, F'2, F''2, in which each laser beam fraction is respectively directed toward a photoconductive element 14, 14', 15, 15' of the generation system 1, 1', in which said splitting means are capable of controlling the distribution of the respective powers of said two laser beam fractions according to the orientation of the polarization of the laser beam. The activation system 2 of one of said N generators includes means 21 for generating said laser beam F. The activation system 2 of at least N−1 generators includes at least one delay means 25, 25', arranged so as to synchronize said generators with one another. Each generator includes separation means 24, 24' arranged so as to direct a portion of said laser beam F transmitted by said generation means 21 toward said splitting means of said generator.

This installation makes it possible to obtain a plurality of pulse generators according to the invention, in which wall of the generators are mutually synchronous. It makes it possible in particular to generate high-voltage, high-power, short electrical pulses, in which said pulses are synchronous and capable of being directed toward a plurality of targets or a plurality of areas of the same target. The desynchronization of a plurality of generators can also be performed by adjusting the delay lines.

Figure 4:
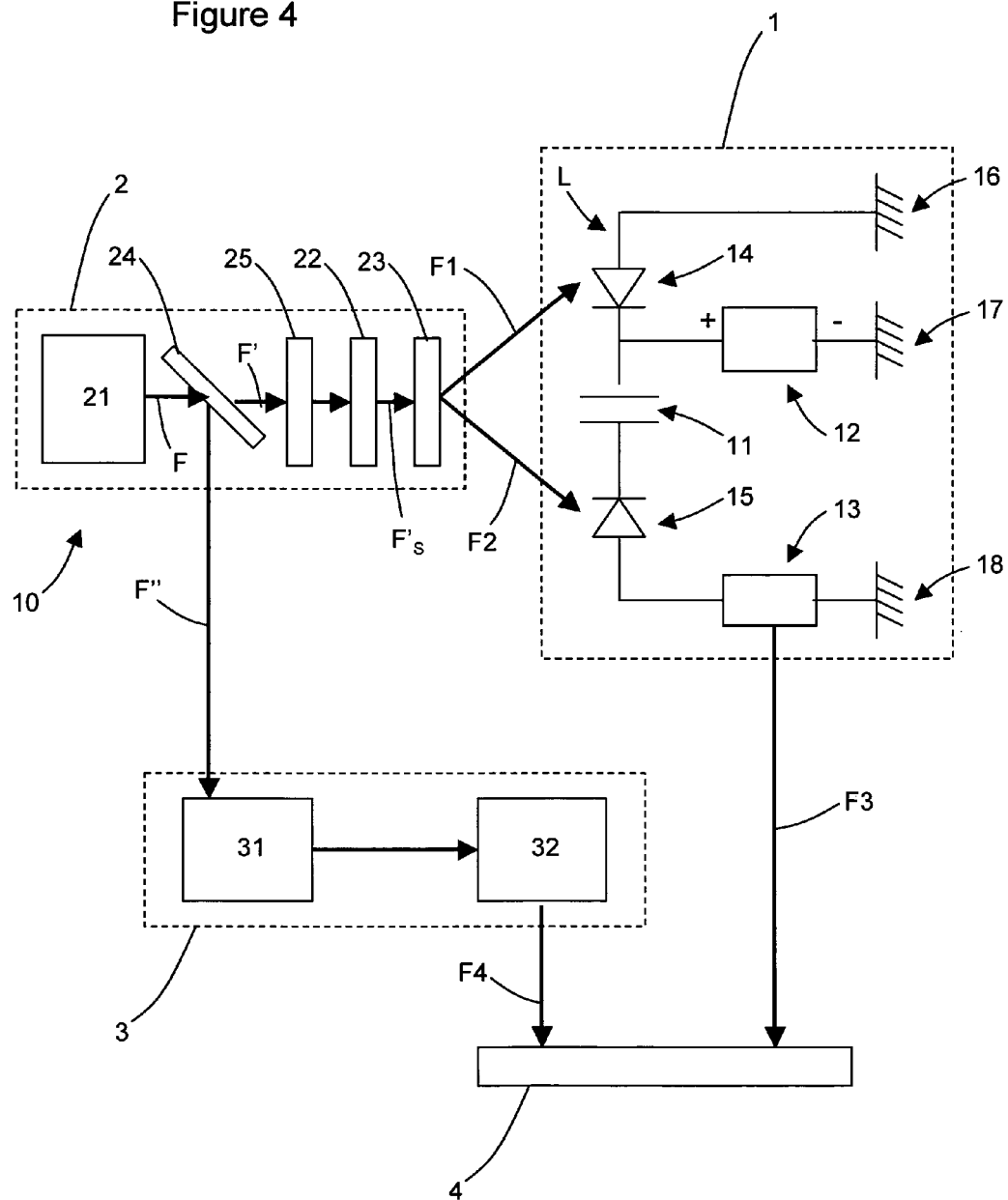
FIG. 4: a diagram of the electro-optical pump-probe equipment implementing a high-voltage electrical pulse generator according to the invention.

FIG. 4 shows the diagram of electro-optical pump-probe equipment implementing a high-voltage electrical pulse generator described above. More specifically, this pump-probe equipment includes a high-voltage pulse generator as described above in reference to FIG. 1. This generator acts as a pump. It includes in particular a high-voltage frozen-wave pulse generation system 1 and a system for activating said pulses 2. The generation system 1 includes a first 14 and a second 15 photoconductive element. The activation system 2 includes means 21 for generating a light laser beam F and means 22, 23 for splitting said laser beam F into at least two laser beam fractions F1, F2. Each laser beam fraction is respectively directed toward a photoconductive element of the generation system. The splitting means are capable of controlling the distribution of the respective powers of said at least two laser beam fractions according to the orientation of the polarization of the laser beam F.

This pump-probe equipment also includes separation means 24 arranged so as to direct a portion F' of said laser beam F toward the generation system 1 and another portion F''' toward said probe system 3. These separation means 24 are constituted by a separating plate 24 placed between the output of the laser source 21 and the half-wave plate 22 associated with the polarizer 23. From the beam F generated by the laser source 21, this plate 24 makes it possible to transmit a laser beam F' in the direction of the splitting system 22, 23 and a laser beam F''' capable of synchronizing the generator with the other systems, in particular other generators, or, as described above, an imaging system. This beam F''' is sufficiently energetic—10 kilowatts-peak—to perform a frequency conversion, for example into a crystal or a nonlinear fiber.

This pump-probe equipment also includes a probe system 3, which includes broadband nonlinear conversion means 31 and nonlinear imaging means 32. The beam F''' coming from the separating plate 24 is directed toward the broadband nonlinear conversion means 31, which makes it possible to change the excitation wavelength by generating a continuum. The continuum thus generated by the conversion means 31 is synchronized with the generator by means of a delay line 25 placed on the path of the beam F'. The conversion means 31 can be, for example, a nonlinear crystal or a nonlinear microstructured fiber.

This pump-probe equipment finally includes delay means 25 making it possible to synchronize the generator and the probe system 3 with one another. These delay means 25 can be a delay line arranged between the separating plate 24 and the plate 22. It is thus arranged on the path of the portion F' of the laser beam F so as to synchronize this portion F' with the other portion F''' of the beam F. According to another embodiment, the delay means 25 can be arranged on the path of the other portion F''' of the beam F so as to synchronize this portion F''' with the portion F' of the beam.

The nonlinear imaging means 32 makes it possible cut and code the continuum generated by the conversion means 32 and to apply the continuum thus processed to the target 4. These imaging means, owing to the nonlinear nature thereof, make it possible to generate complex—and therefore precise—signatures of a given compound by obtaining a spectrum in response to an excitation spectrum transmitted in the direction of the compound. Indeed, linear imaging means do not make it possible to sufficiently distinguish the signature of a single compound from a set of other compounds. These nonlinear imaging means can, for example, be of the CARS type (Coherent Anti-Stokes Raman Spectroscopy). This type of imaging can operate in broadband mode and use a sub-nanosecond light source having a supercontinuum.

This type of imaging is described, for example, in the following publications:

Masanari Okuno, Hideaki Kano, Philippe Leproux, Vincent Couderc, Hiro-o Hamaguchi, "Ultrabroadband (>2000 $cm^{-1}$) Multiplex Coherent Anti-Stokes Raman Scattering Spectroscopy Using a Sub-Nanosecond Supercontinuum Light Source"; Optics Letters, vol. 32, n° 20, p. 3050-3052, 2007, and Masanari Okuno, Hideaki Kano, Philippe Leproux, Vincent Couderc, Hiro-o Hamaguchi, "Ultrabroadband multiplex CARS microspectroscopy and imaging using a subnanosecond supercontinuum light source in the deep near infrared", to be published in Optics Letters 2008.

According to other specific embodiments, the imaging means can be SHG imaging (Second Harmonic Generation), by fluorescence or diffraction. Such electro-optical pump-probe equipment has the twofold advantage of benefiting from the generation of high-voltage, high-power electrical pulses, with an adjustable profile and a short duration, while being synchronous with a probe for testing the target 4. These additional effects are made possible by the use of the laser source 21 both as means for activating the pulses generated by the generation system 1 and as means for synchronization with an imaging system enabling the target to be tested.

According to a specific embodiment, the pump-probe equipment includes a plurality of high-voltage electrical pulse generators described above, which generators are connected to one another and synchronized. Equipment according to this invention has applications in particular, but in a non-limiting manner, in the medical field. Indeed, the current cell electrostimulation systems use electronic generators producing long microsecond or millisecond pulses. However, some cells are capable of responding to much shorter excitations, on the order of a nanosecond, a picosecond or a femtosecond.

The prior art systems do not enable a real-time analysis of the influence of these very short electromagnetic pulses due to the non-synchronization of the excitation and/or imaging systems. This invention makes it possible to solve this problem, since the electrical pulse is directly generated by the optical wave, of which a portion will be dedicated to the diagnostic or imaging system. The generator is thus synchronized with other generators or with other electrical or optical systems. Under these conditions, the absence of time jitter between the pulse and the photoswitched electrical wave enables the real-time analysis of the impact thereof on biological elements. Moreover, the management of the optical switching energy makes it possible to modify the spectrum of the electrical pulse, and the use of a microchip-type laser makes it possible to minimize the bulk and significantly reduce the cost of such a system.

A generator according to this invention also has applications in the field of electronic imaging, for example for radars, in order to arrange a plurality of systems in parallel or simultaneously activate a plurality of electronic switches. More generally, a generator according to the invention can have applications when the synchronization of a plurality of electrical or optical systems and/or high-voltage electrical pulse generators is desired.

The invention claimed is:

1. A high-voltage pulse generator comprising a high-voltage frozen-wave pulse generation system and a system for activating said pulses, in which said generation system includes a first and a second photoconductive element, said activation system further comprising a beam generator operably generating a laser light beam and at least one splitter operably splitting said laser beam into two laser beam fractions, in which each laser beam fraction is directed respectively toward a photoconductive element of said generation system, and said at least one splitter is capable of controlling the distribution of the respective powers of said two laser beam fractions according to orientation of polarization of said laser beam.

2. The high-voltage pulse generator according to claim 1, in which the at least one splitter further comprises a rectilinear polarization phase delay and a beam separation rectilinear polarizer arranged so as to separate said laser beam into said two laser beam fractions, in which each laser beam fraction is directed respectively toward said photoconductive element of said generation system, and distribution of respective powers of said two laser beam fractions is controlled by orienting said rectilinear polarization phase delay.

3. The high-voltage pulse generator according to claim 2, in which said phase delay with rectilinear polarization is constituted by a half-wave plate of which an optical axis is perpendicular to a sighting axis of said laser beam.

4. The high-voltage pulse generator according to claim 2, wherein said rectilinear polarizer is a Wollaston-type polarizer.

5. The high-voltage pulse generator according to claim 1, wherein said pulse activation system also includes focusing means arranged in front of rectilinear polarizer, so as to focus each of said laser beam fractions respectively on said photoconductive element of said generation system.

6. The high-voltage pulse generator according to claim 1, wherein said laser beam generator is of the microlaser type.

7. An installation of multiple high-voltage pulse generators comprising:
N high-voltage pulse generators, in which N is greater than or equal to two, and each of said generators includes a high-voltage frozen-wave pulse generation system and a system activating said pulses, in which said generation system includes a first and a second photoconductive element;
said activation system of each generator includes splitters operably splitting a laser beam into two laser beam fractions, in which each of said laser beam fraction is respectively directed toward a photoconductive element of said generation system, and said splitters operably control distribution of respective powers of said two laser beam fractions according to orientation of polarization of said laser beam;
said activation system of one of said N generators includes a beam generator operably generating said laser beam;
said activation system of at least N−1 generators includes at least one delay arranged so as to synchronize said generators with one another; and
each of said generators includes at least one separator arranged so as to direct a portion of said laser beam transmitted by said beam generator toward said splitters of said generator.

8. Electro-optical pump-probe equipment comprising a high-voltage pulse generator and a probe system, in which said generator includes a high-voltage frozen-wave pulse generation system and a system for activating said pulses, in which said generation system includes a first and a second photoconductive element;
said activation system includes means for generating a light laser beam and means for splitting said laser beam into at least two laser beam fractions, in which each of said laser beam fractions is respectively directed toward a photoconductive element of said generation system, and said splitting means are capable of controlling the distribution of the respective powers of said at least two laser beam fractions according to orientation of polarization of laser beam;
said generator includes separation means arranged so as to direct a portion of said laser beam toward said generation system and another portion toward said probe system; and
the equipment comprises at least one delay means, which delay means are arranged on a path of one of said portions of said laser beam so as to synchronize said generator and said probe system with one another.

9. The electro-optical pump-probe equipment according to claim 8, in which said light beams coming from said generator and said probe system are directed toward the same target.

10. The electro-optical pump-probe equipment according to claim 8, wherein said probe system comprises broadband nonlinear conversion means.

11. The electro-optical pump-probe equipment according to claim 8, wherein said probe system comprises imaging means.

12. The electro-optical pump-probe equipment according to claim 11, wherein said imaging means are of a nonlinear CARS type.

13. The electro-optical pump-probe equipment according to claim 11, wherein said imaging means are of a nonlinear second harmonic generation type.

14. The electro-optical pump-probe equipment according to claim 11, wherein said imaging means are of a nonlinear fluorescence type.

* * * * *